(12) United States Patent
Nagano et al.

(10) Patent No.: US 6,172,731 B1
(45) Date of Patent: Jan. 9, 2001

(54) DISPLAY DEVICE INCLUDING REINFORCING PLATE BETWEEN CIRCUIT SUBSTRATE AND DISPLAY PANEL

(75) Inventors: Mitsuru Nagano, Yao; Nobuaki Takahashi, Nara; Yoshitsugu Kawahigashi, Kitakatsuragi-gun; Akira Murakami, Yamatokoriyama, all of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/055,307

(22) Filed: Apr. 6, 1998

(30) Foreign Application Priority Data

Apr. 16, 1997 (JP) .................................................. 9-099349

(51) Int. Cl.[7] .................................................. G02F 1/1345
(52) U.S. Cl. .......................... 349/150; 349/152; 349/151
(58) Field of Search .................................... 349/149, 150, 349/151, 152

(56) References Cited

U.S. PATENT DOCUMENTS

| 4,666,254 | * | 5/1987 | Itoh et al. | 349/150 |
|---|---|---|---|---|
| 4,862,153 | * | 8/1989 | Nakatani et al. | 349/150 |
| 5,193,022 | * | 3/1993 | Hirai | 349/150 |
| 5,375,003 | * | 12/1994 | Hirai | 349/150 |

FOREIGN PATENT DOCUMENTS

| 4-269723 | 9/1992 | (JP) . |
|---|---|---|
| 8-152644 | 6/1996 | (JP) . |

* cited by examiner

*Primary Examiner*—James A. Dudek
*Assistant Examiner*—Toan Ton
(74) *Attorney, Agent, or Firm*—Nixon & Vanderhye P.C.

(57) ABSTRACT

A reinforcing plate is made up of a planar member which is composed of a panel fixture portion and connecting parts provided at both ends of the panel fixture portion. A scan signal input circuit substrate for supplying a scan signal to a display panel and a data signal input circuit substrate for supplying data are provided on respective sides of the display panel. The scan signal input circuit substrate has an input connector and electronic parts such as driver ICs etc., mounted thereon. The connecting parts of the reinforcing plate are fixed to the scan signal input circuit substrate so as not to interfere with the electronic parts while the panel fixture portion of the reinforcing plate is fixed to the display panel.

5 Claims, 9 Drawing Sheets

DISPLAY DEVICE INCLUDING REINFORCING PLATE BETWEEN CIRCUIT SUBSTRATE AND DISPLAY PANEL

BACKGROUND OF THE INVENTION (1) Field of the Invention

The present invention relates to a display device for use in an electronic appliance such as a FA appliance, AV appliance, OA terminal etc., as well as an advertisement display.

(2) Description of the Prior Art

Figure 1A:
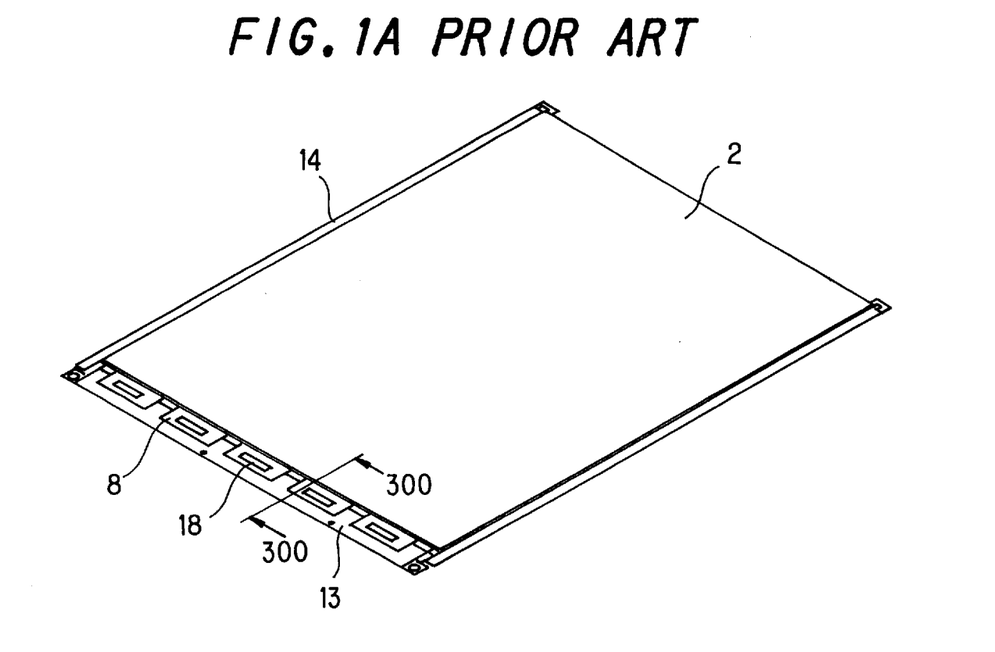
FIG. 1A is a perspective view showing a conventional display device, viewed from the obverse side.
Figure 1B:
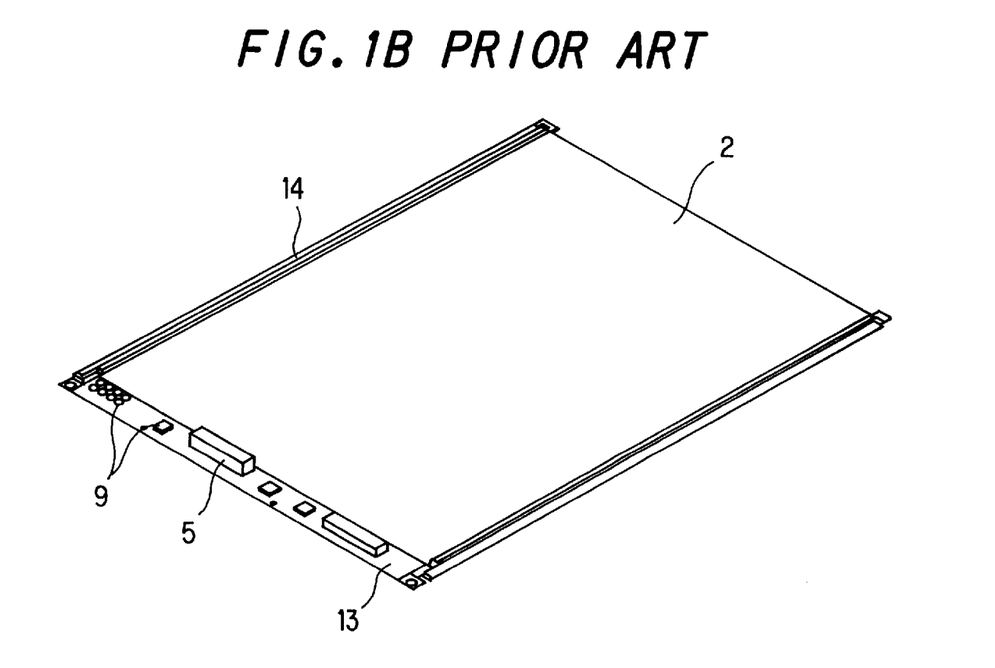
FIG. 1B is a perspective view showing a conventional display device, viewed from the reverse side.
Figure 3:
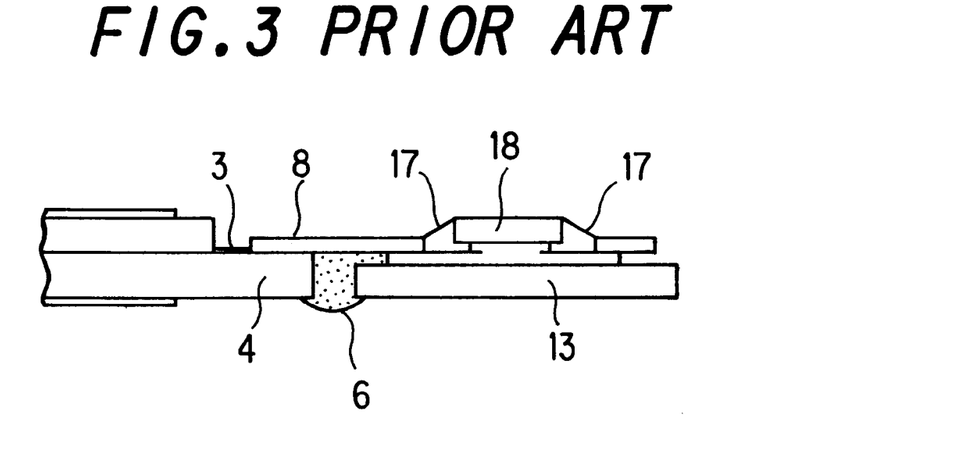
FIG. 3 is a sectional view showing a conventional display device.
Figure 4:
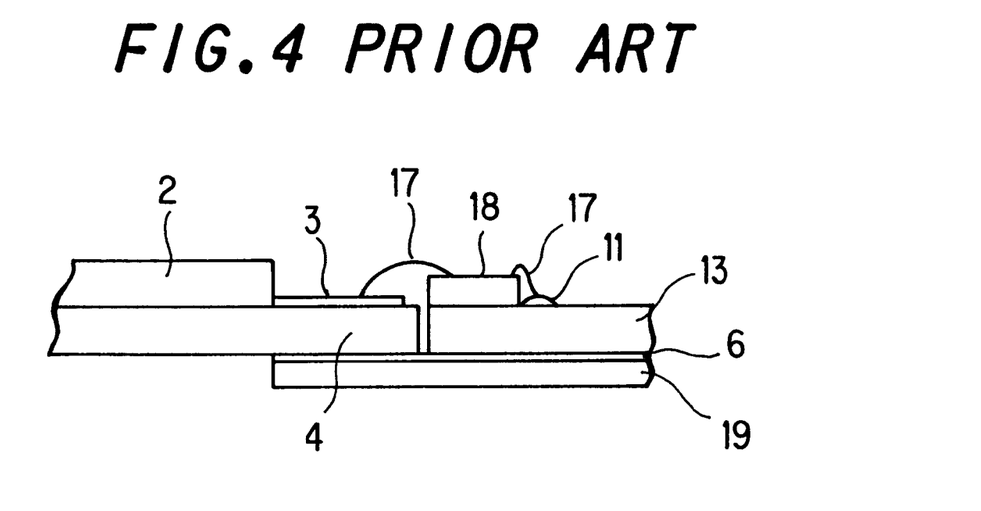
FIG. 4 is a sectional view showing another conventional display device.

The prior art will be described with reference to FIGS. 1 through 4. FIG. 1 Is a perspective view showing a conventional display device; FIG. 1A is a view from the obverse side of the display device and FIG. 1B is a view from the reverse side thereof. FIG. 2 contains diagrams showing the forces and their components when the input connector is inserted. FIG. 3 is a sectional view showing a prior art display device. FIG. 4 is a sectional view showing another prior art display device.

As shown in FIG. 1, the conventional display device comprises: a display panel 2; a scan signal input circuit substrate 13 disposed along the length of one side of display panel 2 for inputting the scan signal to display panel 2; and a data signal input circuit substrate 14 disposed along the length of the other side for inputting data to the display panel 2. The display panel 2 is composed of a pair of glass substrates for inputting the scan signal and data, respectively, and a liquid crystal material sealed therein; each glass substrate has a pattern of electrode leads (designated at 3 in FIG. 2), which consists of tin oxide, indium oxide or the like, formed on the opposing surface to the other. This pattern of electrode leads 3 is joined to a flexible circuit substrate 8 so that the display panel 2 is electrically connected to scan signal input circuit substrate 13 having, for example, an input connector 5, electronic parts 9, driver ICs 18 etc. provided thereon.

Figure 2A:
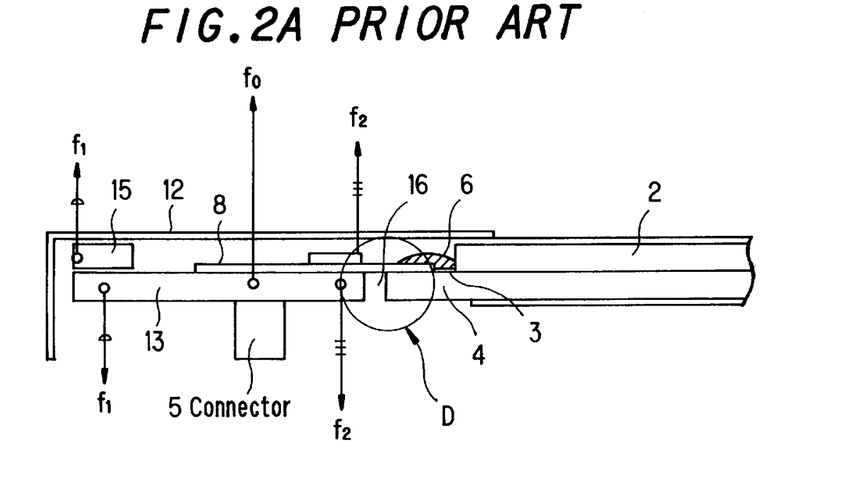
FIGS. 2A through 2C are diagrams showing components of forces in a conventional display device.

FIG. 2A is a sectional view cut along a plane 300—300 in FIG. 1A, showing the detailed configuration of the above electric connection. In the figure, a glass terminal 4 of display panel 2 and scan signal input circuit substrate 13 are placed opposedly with a gap 16 therebetween so that pattern of electrode leads 3 formed on glass terminal 4 is connected with scan signal input circuit substrate 13 by flexible circuit substrate 8. The joint between pattern of electrode leads 3 and flexible circuit substrate 8 is protected by resin 6.

In this conventional arrangement the thus configured joint in some cases peeled off due to the stress generated in pattern of electrode leads 3 and/or flexible circuit substrate 8 extending across gap 16 when input connector 5 was handled f or attachment or removal. For example, suppose that a force $f_0$ is applied when input connector 5 is handled for attachment or removal as shown in FIG. 2A. In this case, force $f_0$ can be decomposed into force component $f_1$ acting on spacer 15 and force component $f_2$ acting at the joint of flexible circuit substrate 8. This force component $f_2$ would cause the peeling.

Figure 2B:
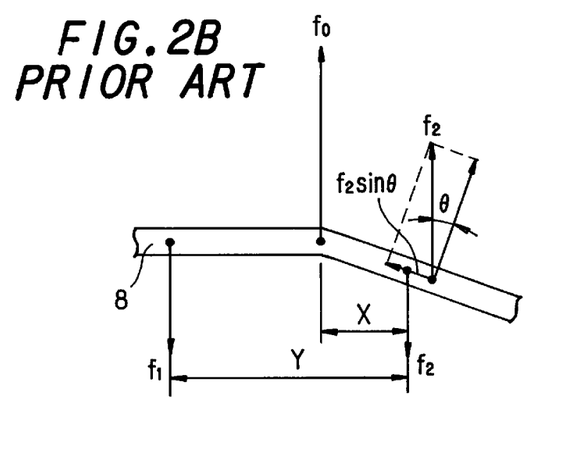

Next, this peeling force will be explained with reference to FIG. 2B.

Force $f_0$ applied on input connector 5 can be decomposed into force component $f_1$ shown in expression (1) and force component $f_2$ shown in expression (2) as follows:

$$f_1 = (X/Y) \cdot f_0 \quad (1)$$

$$f_2 = [1 - (X/Y)] f_0 \quad (2)$$

where $f_0$: connector insertion force;

$f_1$: spacer pressing force;

$f_2$: stress;

X: distance between $f_0$ and $f_2$; and

Y: distance between $f_1$ and $f_2$.

Figure 2C:
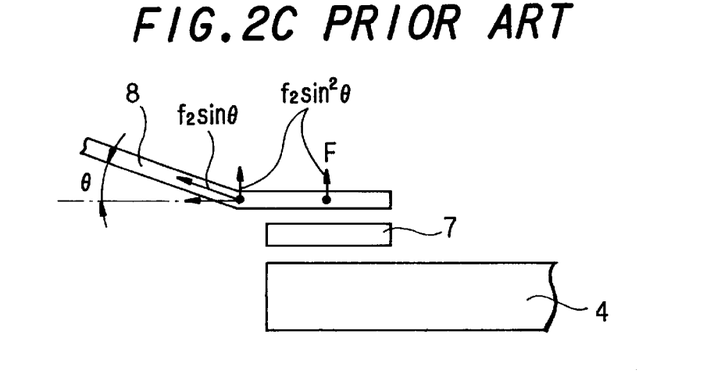

This force component $f_2$ warps flexible circuit substrate 8. If this bending is represented by an angle θ, the component of force along flexible circuit substrate 8 which is deformed results in $f_2 \sin θ$. Further, as shown in FIG. 2C, this force causes a peeling force F of $f_2 \sin^2 θ$, thus separating flexible circuit substrate 8 from anisotropic conductive film 7 having pattern of electrode leads 3 formed on glass terminal 4. Force component $f_1$ of force $f_0$ is borne by a bezel 12. Here, FIG. 2C is an enlarged view of an encircled portion D in FIG. 2A.

Various countermeasures have conventionally been taken against the above problem.

The first method is one in which, as shown in FIG. 2A, resin 6 of an epoxy or acrylic type is filled in the joint with glass terminal 4 so as to integrate display panel 2 with flexible circuit substrate 8.

The second method is that disclosed in Japanese Patent Application Laid-Open Hei 4 No. 269,723, as shown in FIG. 3 in which the gap between glass terminal 4 and scan signal input circuit substrate 13 is provided with resin 6 so as to fill up the space which might, otherwise, cause the deformation.

Further, the third method is disclosed in Japanese Patent Application Laid-Open Hei 8 No. 152,644, as shown in FIG. 4. That is, glass terminal 4 and scan signal input circuit substrate 13 are made to abut each other at their end faces while a reinforcing plate 19 is disposed across the non-displaying area of display panel 2 and the entire surface of scan signal input circuit substrate 13 and bonded with resin 6.

However, the first method cannot provide high enough strength to stop peeling, as already stated.

In the second method, the rigidity of the structure is enhanced since the gap between glass terminal 4 and scan signal input circuit substrate 13 is filled up with resin 6. This method, however, needs a prolonged time for application and drying of resin 6 and handling will become difficult when scan signal input circuit substrate 13 needs to be detached for repair.

In the third method, the strength to stop peeling can be enhanced, but the handling will be degraded as in the second embodiment. Further, since reinforcing plate 19 is applied throughout the rear surface of scan signal input circuit substrate 13, all electric parts such as driver ICs 18 etc., must be mounted on the obverse face of scan signal input circuit substrate 13. This configuration constrains the arrangement of the parts and increases cost due to the use of reinforcing plate 19.

SUMMARY OF THE INVENTION

It is therefore an object of the present invention to provide a display device which is less costly in terms of parts and manufacturing, and still provides high enough strength for the fixture between the display panel and the circuit substrate for driving the panel, so as to prevent the electric connection between the display panel and circuit substrate from deteriorating under the stress generated between the display panel and circuit substrate when the connector is attached or removed and hence ensure high handling performance.

In order to achieve the above object, the present invention is configured as follows:

In accordance with the first aspect of the invention, a display device comprises:

a display panel;

a circuit substrate disposed, at the periphery of and beside, the display panel with a predetermined gap therebetween;

a flexible circuit substrate extending across the gap to connect the display panel with the circuit substrate; and a reinforcing plate having a plurality of connecting parts to be joined to the circuit substrate and a fixture portion to be fixed to the display panel, and is characterized in that the reinforcing plate is fixed to the circuit substrate and display panel, on the side opposite to the one on which the flexible circuit substrate is provided.

In accordance with the second aspect of the invention, the display device having the above first feature is characterized in that the connecting parts of the reinforcing plate are fixed by soldering at positions where the joint will not interfere electronic parts mounted on the circuit substrate.

In accordance with the third aspect of the invention, the display device having the above first feature is characterized in that the reinforcing plate is made of metal.

In accordance with the fourth aspect of the invention, a display device comprises:

a display panel;

a circuit substrate disposed, at the periphery of and beside, the display panel with a predetermined gap therebetween;

a flexible circuit substrate extending across the gap to connect the display panel with the circuit substrate; and a reinforcing plate having a fixture portion to be fixed to the display panel and a plurality of connecting parts each of which is bent and stepped so as to be joined to the circuit substrate, on the side where the flexible circuit substrate is provided, and is characterized in that the fixture portion of the reinforcing plate is fixed to the side of the display panel, opposite to the one on which the flexible circuit substrate is provided, while the connecting parts are extended passing through the gap to the side on which the flexible circuit substrate is provided, and joined to the circuit substrate on the side thereof.

In accordance with the fifth aspect of the invention, the display device having the above fourth feature is characterized in that the connecting parts of the reinforcing plate are fixed by soldering at positions where the joint will not interfere electronic parts mounted on the circuit substrate.

In accordance with the sixth aspect of the invention, the display device having the above fourth feature is characterized in that the reinforcing plate is made of metal.

In accordance with the above configuration, the circuit substrate and the display panel can be joined firmly so as to prevent the flexible circuit substrate from peeling off. Further, the reinforcing plate can be fixed by soldering so that the plate will not interfere with the electronic parts on the circuit substrate. As a result, it is possible to ensure the optional design arrangement of the electronic parts.

DESCRIPTION OF THE PREFERRED EMBODIMENTS

The embodiment of the invention will be described with reference to FIGS. 5 through 12.

Figure 5:
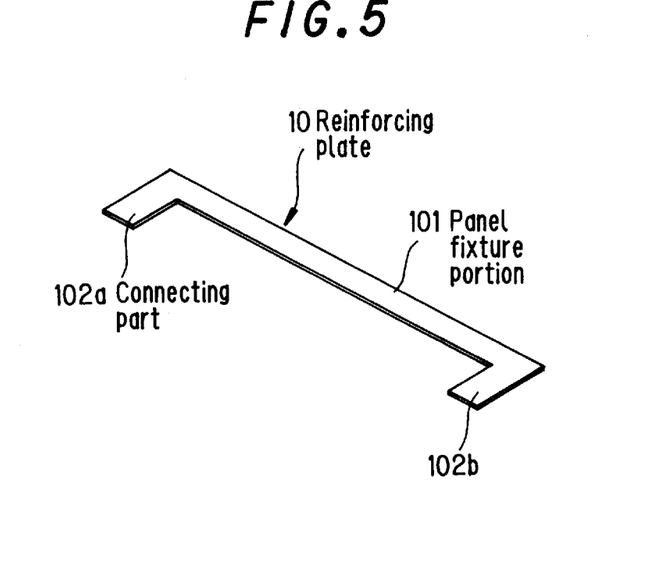
FIG. 5 is a view showing a reinforcing plate of a display device in accordance with the first embodiment of the invention.
Figure 6:
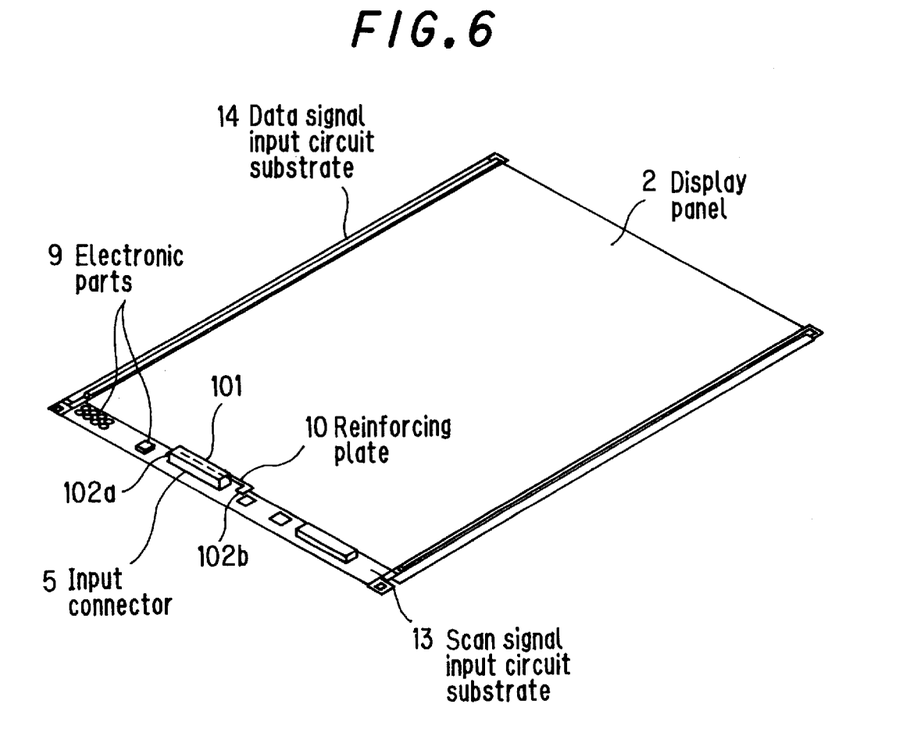
FIG. 6 is a perspective view showing a configuration of a display device in which the reinforcing plate shown in FIG. 5 used.
Figure 7:
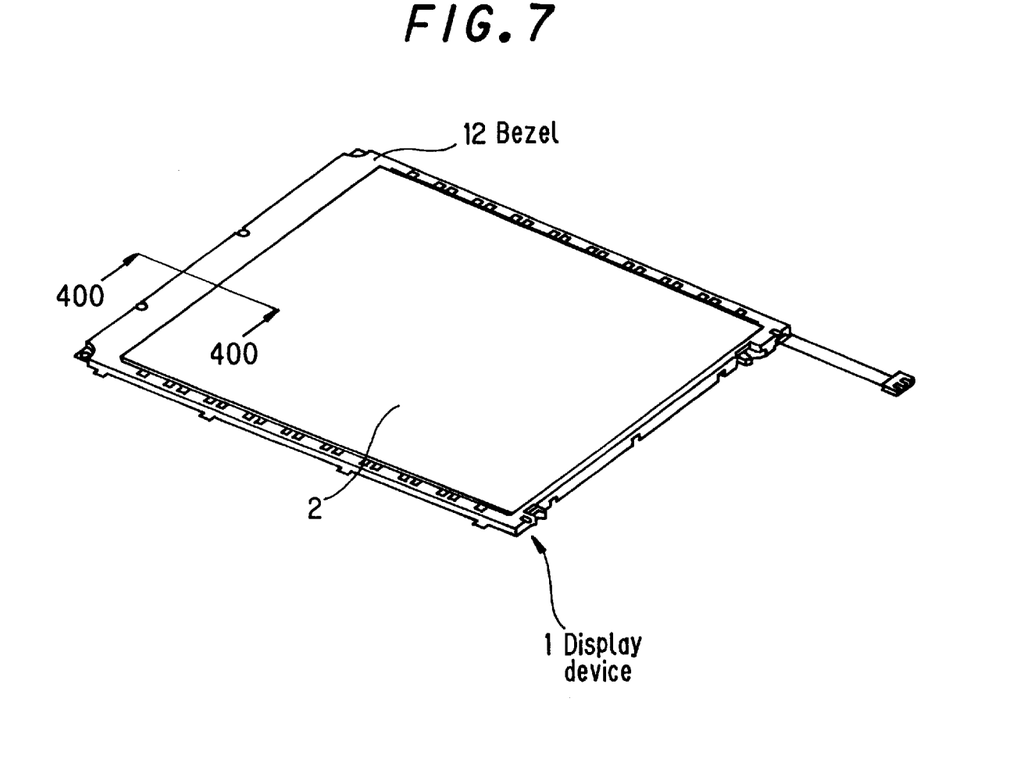
FIG. 7 is a perspective view showing a display device in accordance with the invention.

FIG. 5 shows a reinforcing plate 10 in accordance with the first embodiment. The plate is composed of a planar portion comprising: a panel fixture portion 101; and connecting parts 102a and 102b provided at both ends of panel fixture portion 101. FIG. 6 is a display device using the reinforcing plate 10 (with no bezel 12 which is shown in FIG. 7). The display device has a scan signal input circuit substrate 13 disposed along the length of one side of display panel 2 for inputting the scan signal thereto and a data signal input circuit substrate 14 disposed along the length of the other side thereof for inputting data. Scan signal input circuit substrate 13 has, for example, an input connector 5, electronic parts 9 including driver ICs 18 etc. provided thereon. Connecting parts 102a and 102b of reinforcing plate 10 are affixed to the scan signal input circuit substrate 13 side while panel fixture portion 101 is affixed to the display panel 2 side. For example, in FIG. 6, connecting parts 102a and 102b of reinforcing plate 10 are fixed at both sides of input connector 5 provided on scan signal input circuit substrate 13.

Figure 8:
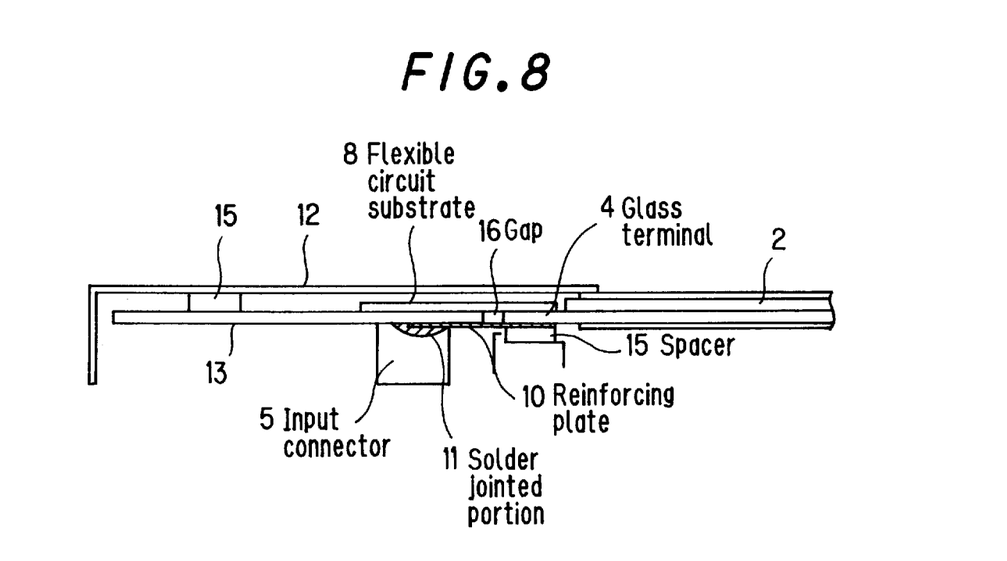
FIG. 8 is a sectional view, cut along a plane 400—400 in FIG. 7.

FIG. 7 is a display device 1 using reinforcing plate 10. FIG. 8 is a sectional view, cut along plane 400—400 in FIG. 7. Glass terminal 4 of display panel 2 and scan signal input circuit substrate 13 are arranged to oppose each other with a gap 16 therebetween. The two are connected electrically by a flexible circuit substrate 8. Reinforcing plate 10 of the invention is affixed between glass terminal 4 and scan signal input circuit substrate 13 extending across gap 16. Fixing of reinforcing plate 10 with scan signal input circuit substrate 13 is made, for example, by soldering at solder jointed portions 11. These are soldered so that the solder jointed portions will not interfere with electronic parts 9, while reinforcing plate 10 is fixed to glass terminal 4 with adhesive tape, etc. The other end of flexible circuit substrate 8 is pressed between bezel 12 and substrate 13 with a spacer 15 therebetween.

Here, a preferred example of a metal for constituting the reinforcing plate is phosphor bronze, which presents strong rigidity even when it is thin.

Figure 9:
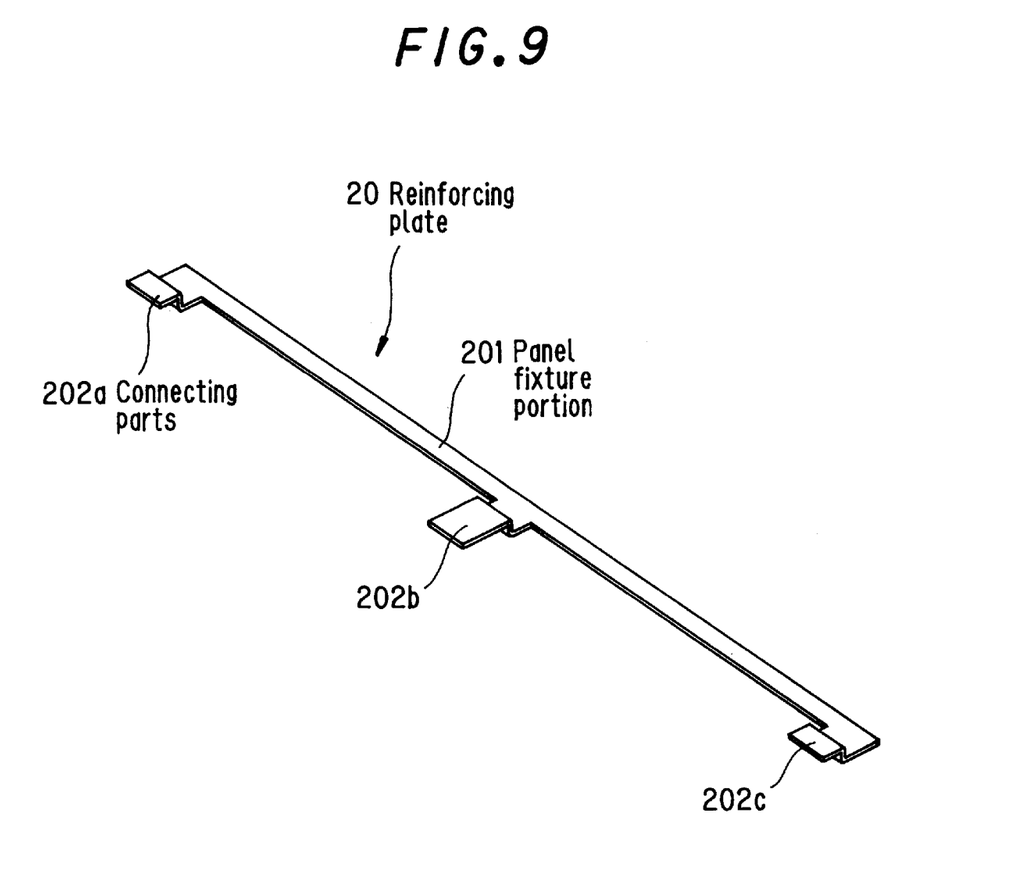
FIG. 9 is a view showing a reinforcing plate of a display device in accordance with the second embodiment of the invention.
Figure 10A:
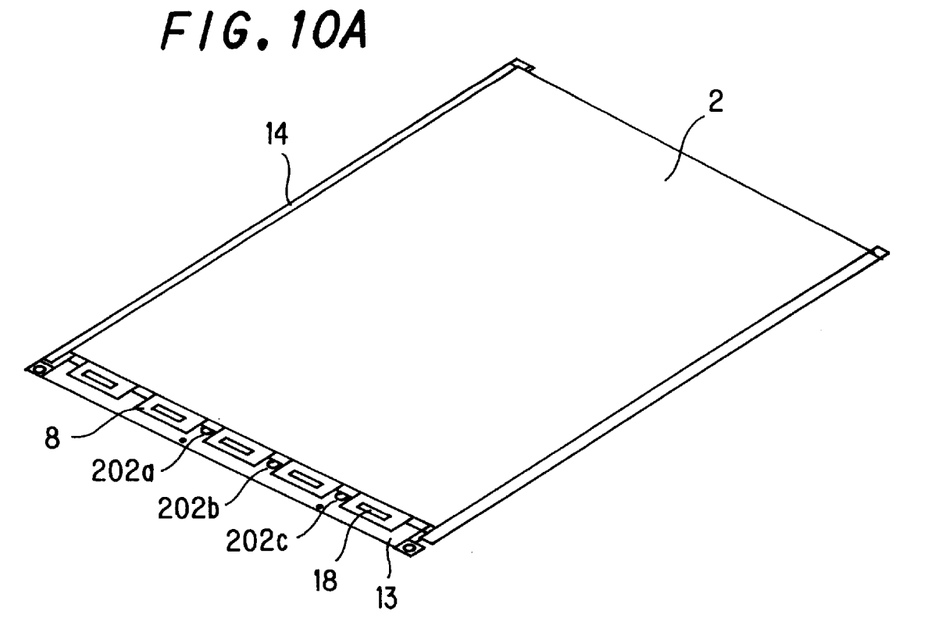
FIG. 10A is a perspective view showing a display device with the reinforcing plate shown in FIG. 9, viewed from the obverse face.
Figure 10B:
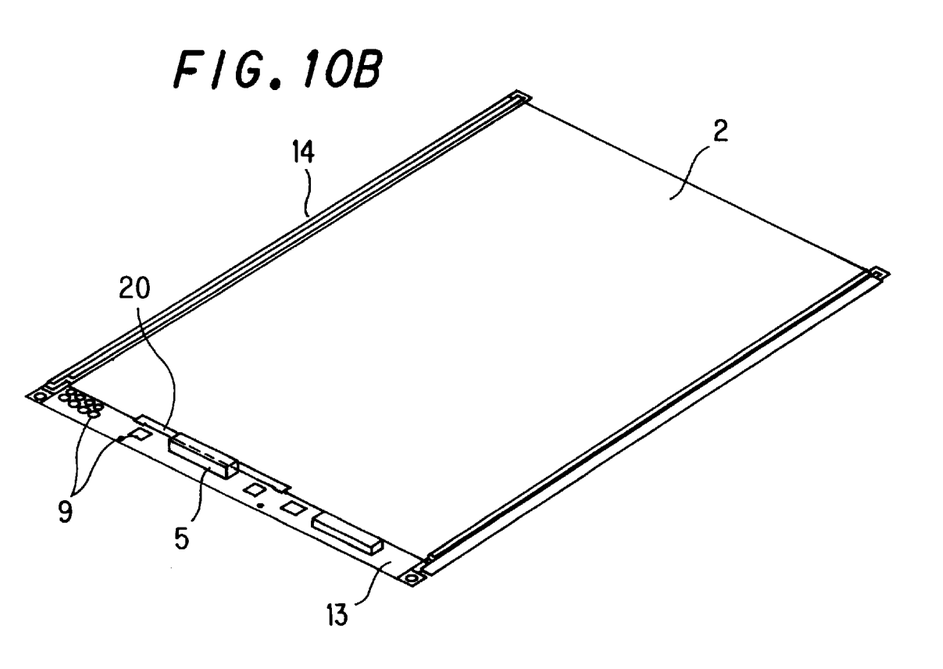
FIG. 10B is a perspective view showing a display device with the reinforcing plate shown in FIG. 9, viewed from the reverse face.

FIG. 9 shows a reinforcing plate 20 in accordance with the second embodiment. This plate comprises a panel fixture portion 201, connecting parts 202a, 202b and 202c formed in panel fixture portion 201. These connecting parts 202a, 202b and 202c are bent so as to form a step with respect to panel fixture portion 201. FIG. 10 is a display device using reinforcing plate 20. This display device has a scan signal input circuit substrate 13 disposed along the length of one side of display panel 2 for inputting the scan signal thereto and a data signal input circuit substrate 14 disposed along the length of the other side thereof for inputting data. Scan signal input circuit substrate 13 has, for example, an input connector 5, electronic parts 9 including driver ICs 18 etc. provided thereon. Connecting parts 202a, 202b and 202c of reinforcing plate 20 are fixed upon the front face of scan signal input circuit substrate 13 as shown in FIG. 10A while panel fixture portion 201 is fixed on the rear face of display panel 2 as shown in FIG. 10B.

Figure 11:
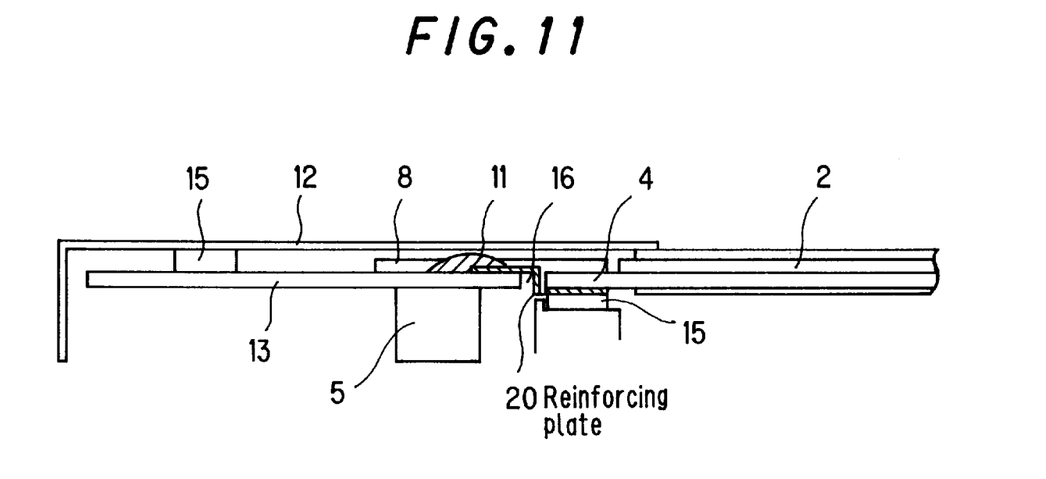
FIG. 11 is a sectional view showing a display device with the reinforcing plate shown in FIG. 9, cut along the plane corresponding to a plane 400—400 in FIG. 7.

FIG. 11 is a sectional view showing a display device using reinforcing plate 20. Glass terminal 4 of display panel 2 and scan signal input circuit substrate 13 are arranged to oppose each other with a gap 16 therebetween. The two are connected electrically by a flexible circuit substrate 8. Reinforcing plate 20 is arranged in a manner that its connecting parts 202a, 202b and 202c pass through gap 16 and are fixed on the obverse face of scan signal input circuit 13 by soldering at solder jointed portions 11, while panel fixture portion 201 is fixed to the rear face of glass terminal 4 with adhesive tape, etc. The other end of flexible circuit substrate 8 is pressed between bezel 12 and substrate 13 with a spacer 15 therebetween.

As in the case of reinforcing plate 10, a preferred example of a metal for constituting the reinforcing plate is phosphor bronze, which presents strong rigidity even when it is thin.

Next, the function of the reinforcing plate in accordance with the invention will be described exemplifying reinforcing plate 10. It should be understood that this situation is the same in the case of reinforcing plate 20.

Figure 12A:
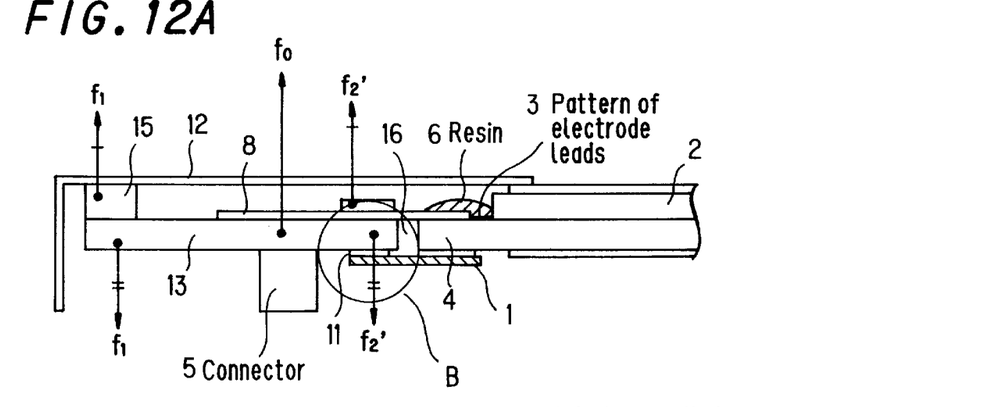
FIGS. 12A through 12D are diagrams showing components of forces for explaining the effect of the invention.
Figure 12B:
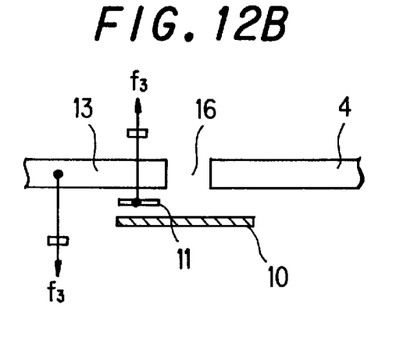
Figure 12C:
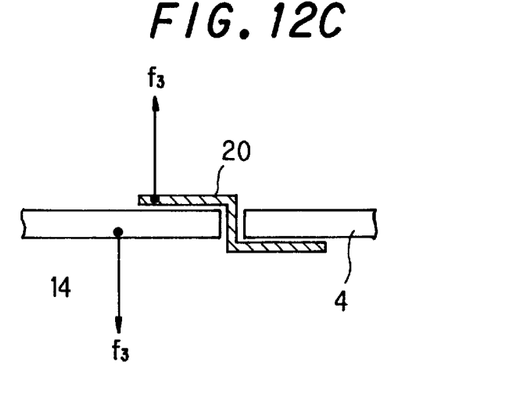

For example, suppose that a force $f_0$ is applied when input connector 5 is handled for attachment or removal as shown in FIG. 12A. In this case, force $f_0$ can be decomposed into force component $f_1$ acting at spacer 15 and force component $f_2'$ acting at the joint of flexible circuit substrate 8. Here, force component $f_2'$ is that corresponding to force component $f_2$ explained in the conventional example, but is equal to force component $f_2$ minus the magnitude of force component $f_3$ shown in FIG. 12B, which is generated because of reinforcing plate 10. In the case of reinforcing plate 20, the situation is similar, as shown in FIG. 12C.

Figure 12D:
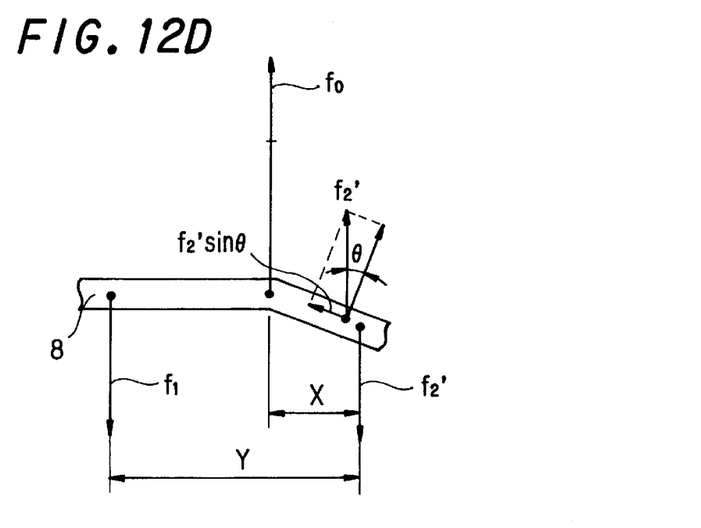

Referring next to FIG. 12D, the peeling force will be described.

Force $f_0$ applied on input connector 5 is decomposed into force component $f_1$ shown in expression (3) and force component $f_2$ shown in expression (4) as follows:

$$f_1 = (X/Y) \cdot f_0 \tag{3}$$

$$f_2 = [1-(X/Y)] \cdot f_0 \tag{4}$$

where $f_0$: connector insertion force;

$f_1$: spacer pressing force;

$f_2$: stress;

X: distance between $f_0$ and $f_2$; and

Y: distance between $f_1$ and $f_2$.

Force $f_2'$ actually applied on the jointed portion of flexible circuit substrate 8 is equal to force $f_2$ minus force $f_3$, or is represented by expression (5):

$$f_2' = f_2 - f_3 = [1-(X/Y)] \cdot f_0 - f_3 \tag{5}$$

If the angle of the bending of flexible circuit substrate 8 is represented by θ, peeling force F is represented by $f_2' \sin^2 θ$, which will act so as to separate flexible circuit substrate 8 from an anisotropic conductive film 7 as the pattern of electrode leads 3 provided on glass terminal 4. However, $f_2'$ is very small because of the normal force $f_3$ obtained from reinforcing plate 10 as stated above, thus reducing the risk of peeling to an acceptable, low level.

Table 1 shows the measurements of connector insertion force $f_0$ (kgf) which caused peeling of the joined portion for comparison between the case where the display device had reinforcing plate 10 and the case where the display device had no reinforcing plate. Five samples were tested for each configuration. From the results in Table 1, it was found that a display device using reinforcing plate 10 had resistance against peeling two to three times as great as one without it.

[Table 1]

Connector insertion force (kgf) at which peeling occurs in joined portion.

| Sample No. | with a reinforcing plate | with no reinforcing plate |
| --- | --- | --- |
| 1 | 15.8 | 8.0 |
| 2 | 15.4 | 9.8 |
| 3 | 25.0 | 10.2 |
| 4 | 17.0 | 7.0 |
| 5 | 22.0 | 7.1 |

As described heretofore, in accordance with the invention, since the display panel is fixed to the circuit substrate for driving the panel with sufficiently high strength, the bending force between the display panel and circuit substrate due to handling such as attachment or removal of the connector is reduced, thus preventing the flexible circuit substrate from peeling off.

Further, when the reinforcing plate is fixed onto the circuit substrate, it is possible to fix it by soldering in such a way as to keep the soldering away from the electric parts on the circuit substrate, and hence it is possible to configure a display device which assures optional design arrangement of mounting the electronic parts and handling performance, and still reduces the cost of parts and manufacturing.

What is claimed is:

1. A display device comprising:

a display panel;

a circuit substrate disposed at a periphery of and beside the display panel with a predetermined gap therebetween;

a flexible circuit substrate extending across the gap to connect the display panel with the circuit substrate;

a reinforcing plate having a plurality of connecting parts to be joined to the circuit substrate and a fixture portion to be fixed to the display panel; and wherein the reinforcing plate is fixed to the circuit substrate and display panel on the side opposite to the side on which the flexible circuit substrate is provided, wherein the connecting parts of the reinforcing plate are fixed by soldering at positions where a resulting joint will not interfere with electronic parts mounted on the circuit substrate.

2. The display device according to claim 1, wherein the reinforcing plate is made of metal.

3. A display device comprising:

a display panel;

a circuit substrate disposed at a periphery of and beside the display panel with a predetermined gap therebetween;

a flexible circuit substrate extending across the gap to connect the display panel with the circuit substrate;

a reinforcing plate having a fixture portion to be fixed to the display panel and a plurality of connecting parts each of which is bent and stepped so as to be joined to the circuit substrate on the side where the flexible circuit substrate is provided; and wherein the fixture portion of the reinforcing plate is fixed to the side of the display panel opposite the side of the display panel on which the flexible circuit substrate is provided, while the connecting parts extend through the gap to the side on which the flexible circuit substrate is provided, and the connecting parts are joined to the circuit substrate on the side thereof.

4. The display device according to claim 3, wherein the connecting parts of the reinforcing plate are fixed by soldering at positions where a resulting joint will not interfere electronic parts mounted on the circuit substrate.

5. The display device according to claim 3, wherein the reinforcing plate is made of metal.

* * * * *